United States Patent [19]
Sasaki

[11] Patent Number: 6,060,923
[45] Date of Patent: May 9, 2000

[54] PLL DEVICE HAVING A SIMPLE DESIGN YET ACHIEVING RELIABLE AND ACCURATE OPERATION

[75] Inventor: Manabu Sasaki, Kawasaki, Japan

[73] Assignee: Fujitsu Limited, Kawasaki, Japan

[21] Appl. No.: 09/190,024

[22] Filed: Nov. 12, 1998

[30] Foreign Application Priority Data

Jan. 27, 1998 [JP] Japan ................................. 10-014389

[51] Int. Cl.[7] .................................................. H03K 7/08
[52] U.S. Cl. ............................................ 327/175; 327/176
[58] Field of Search .................................. 327/176, 175, 327/174, 173, 172, 291, 294

[56] References Cited

U.S. PATENT DOCUMENTS

| | | | |
|---|---|---|---|
| 5,646,565 | 7/1997 | Tukidate | 327/174 |
| 5,723,933 | 3/1998 | Cha | 327/172 |
| 5,812,831 | 9/1998 | Crocker | 395/555 |

FOREIGN PATENT DOCUMENTS

| | | |
|---|---|---|
| 63-64409 | 3/1988 | Japan . |
| 8-149495 | 6/1996 | Japan . |

*Primary Examiner*—Timothy P. Callahan
*Assistant Examiner*—Linh Nguyen
*Attorney, Agent, or Firm*—Armstrong, Westerman, Hattori, McLeland & Naughton

[57] ABSTRACT

A device includes a pulse-width-detection unit which detects pulse widths of an input signal supplied to the device, a pulse-width-information storing unit which stores the pulse widths detected by the pulse-width-detection unit, an operation unit which obtains indication information from the pulse widths stored in the pulse-width-information storing unit, and a pulse-generation unit which generates a pulse signal by delaying the input signal by a delay amount commensurate with the indication information, the pulse signal being supplied to an exterior of the device.

9 Claims, 14 Drawing Sheets

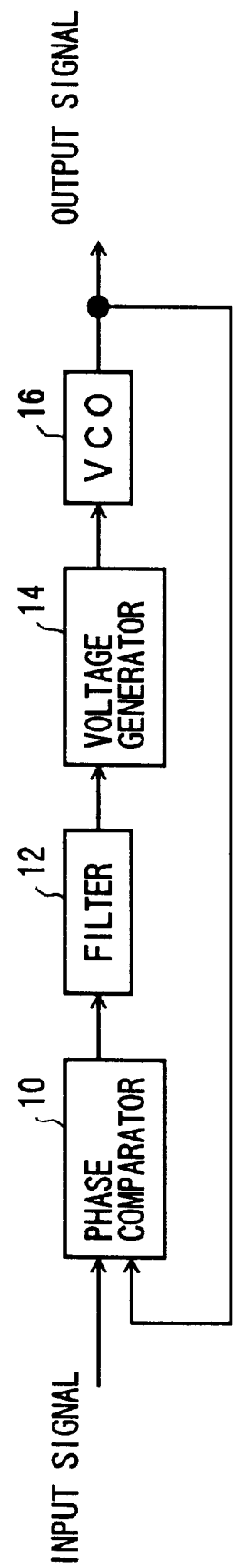
F I G. 1

| FIG.5a | FIG.5b |

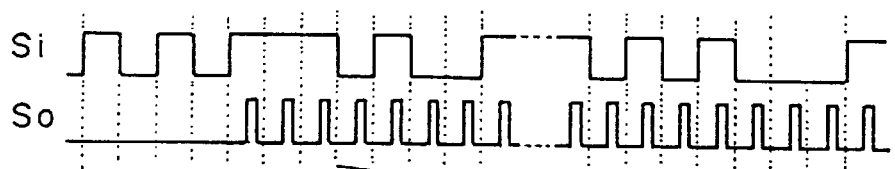
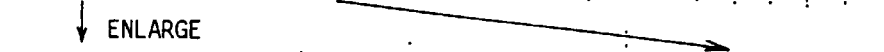
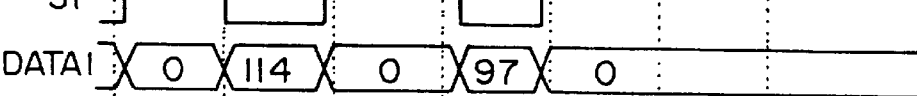
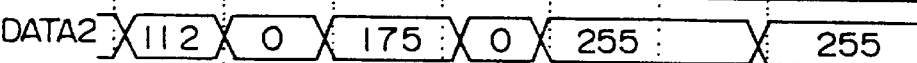
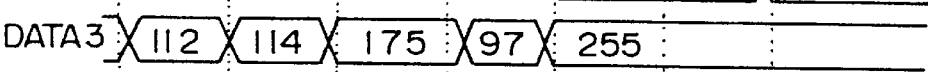
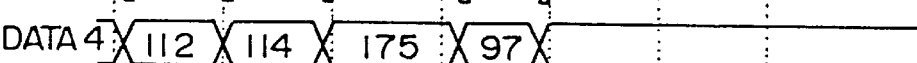
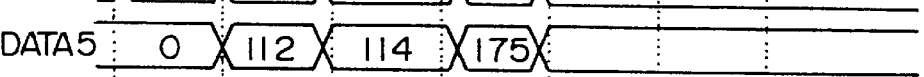
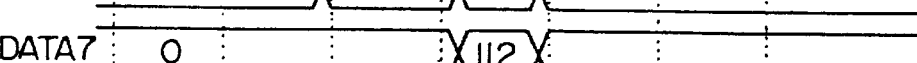
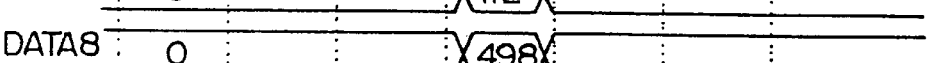
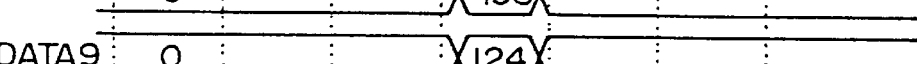
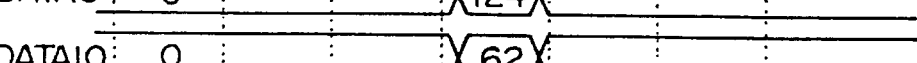
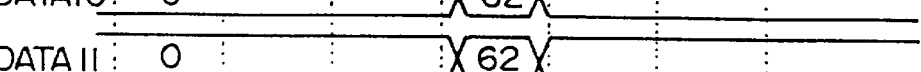
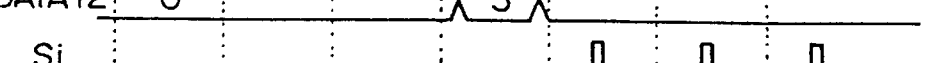
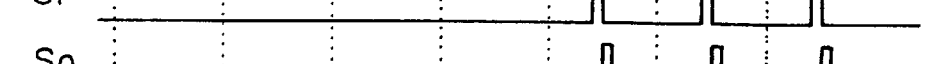

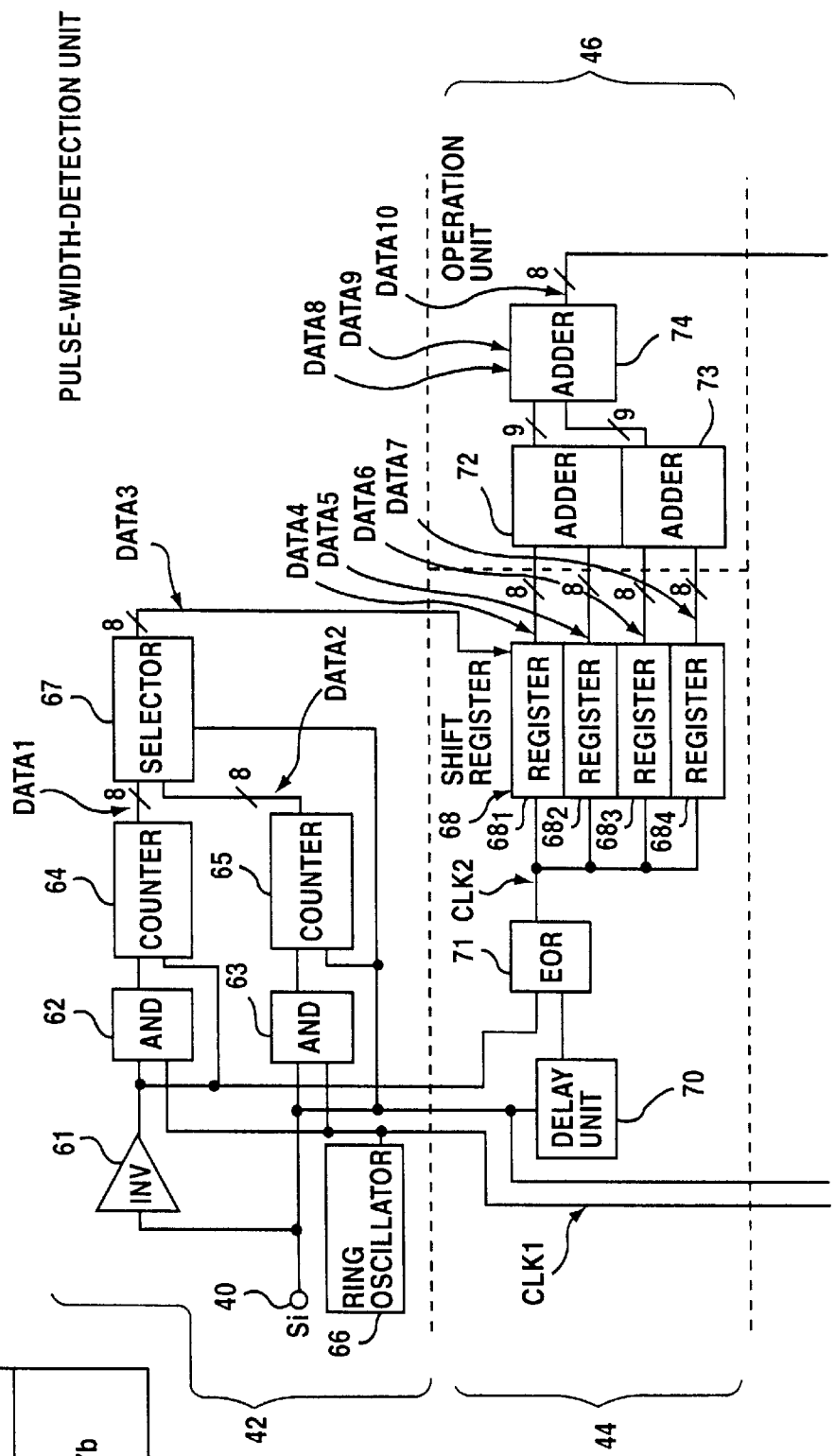

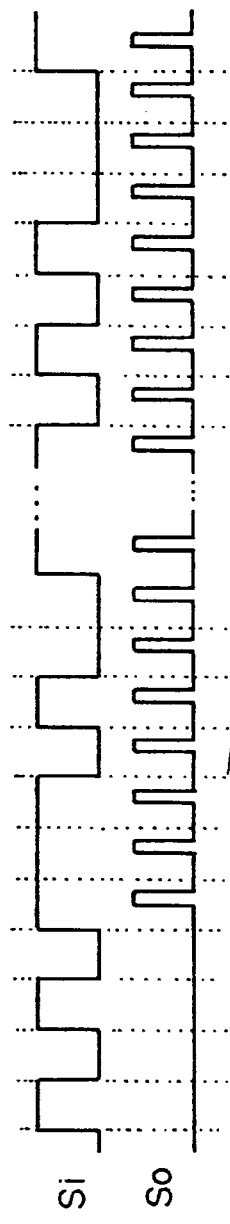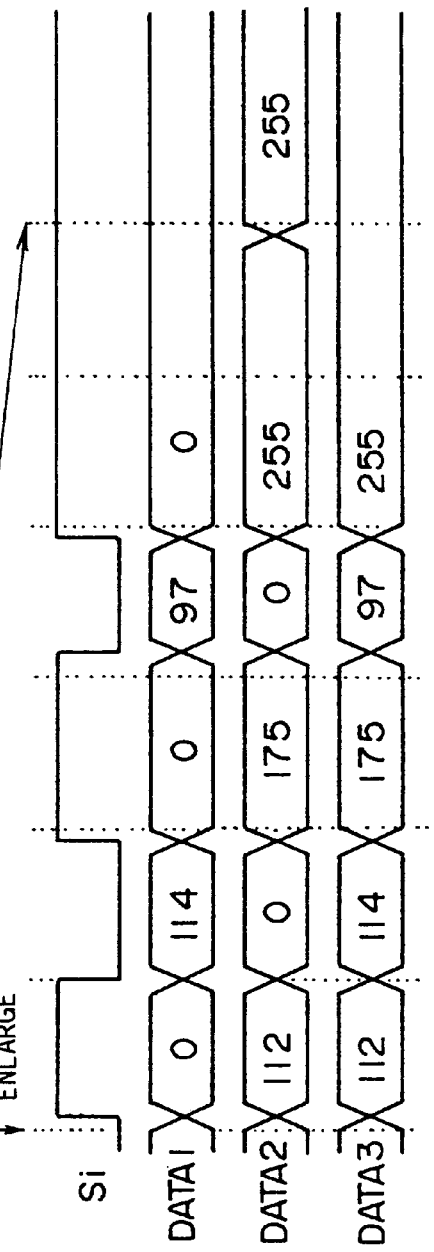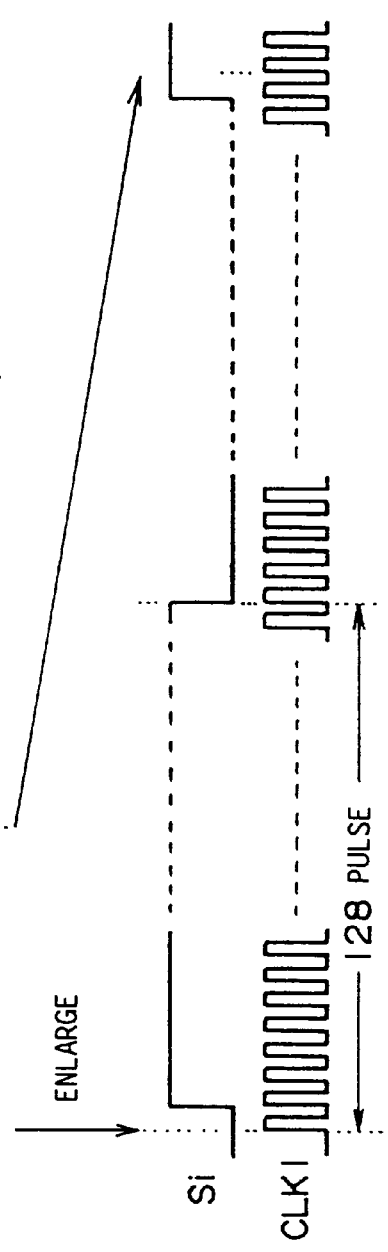

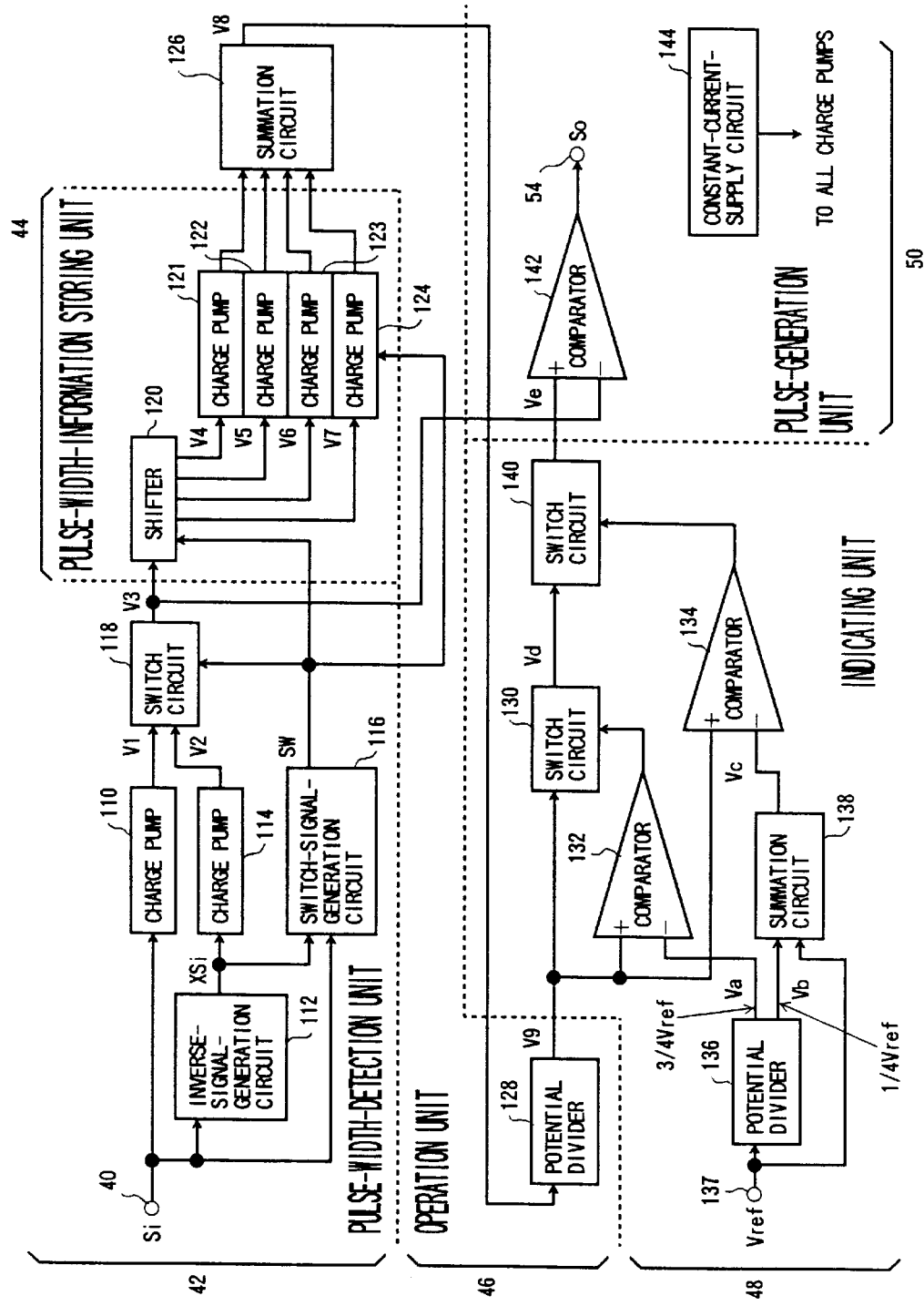

PLL DEVICE HAVING A SIMPLE DESIGN YET ACHIEVING RELIABLE AND ACCURATE OPERATION

BACKGROUND OF THE INVENTION

1. Field of the Invention

The present invention generally relates to PLL (phase-locked loop) devices, and particularly relates to a PLL device which generates a clock signal synchronized with an input clock signal.

In recent years, there has been an increasing demand for a cost reduction in designing communication devices which are faster in signal transmission. In order to meet this demand, a PLL device that is highly accurate and reliable in high-speed signal transmission is required without incurring a high design cost.

2. Description of the Related Art

FIG. 1 is a block diagram showing a configuration of a related-art PLL device. This PLL device is implemented as an analog circuit.

In FIG. 1, a phase comparator 10 compares an input signal with an output clock signal in terms of their phases. A resulting phase-difference signal is supplied to a filter 12, where high-frequency components of the signal are removed, and is then supplied to a voltage generator 14. Based on the supplied signal, the voltage generator 14 generates a voltage level, which is provided to a VCO 16. The VCO 16 generates a pulse signal having a frequency commensurate with the supplied voltage, and this pulse signal is output as the output clock signal.

FIG. 2 is a block diagram showing another configuration of a related-art PLL device. This PLL device is implemented as a digital circuit.

In FIG. 2, communication data in an input signal includes synchronization bits. When a synchronization-bit detector 20 detects the synchronization bits in the input signal, the synchronization-bit detector 20 supplies a detection signal to the indicator 22. The indicator 22 also receives a clock signal which has a frequency N times as high as that of the input signal. The indicator 22 determines which clock pulse of the received clock signal identified in relation to the timing of the detection signal should be used as a synchronization clock pulse in order to maintain synchronization with the input signal until next synchronization bits are supplied. The indicator 22 then gives an instruction to a selector 24. The selector 24 selectively extracts identified pulse of the received clock signal once in every N pulses, and outputs the extracted pulses as a synchronization clock signal.

FIG. 3 is a block diagram showing a configuration of a related-art PLL device. This PLL device is implemented as a digital circuit.

In FIG. 3, an input signal is successively delayed by delay units $30_1$ through $30_N$. Respective outputs of the delay units $30_1$ through $30_N$ are supplied to a selector 32. Further, a phase comparator 34 compares the input signal with an output clock signal in terms of their phases. A resulting phase-difference signal is supplied to the selector 32. Based on the phase-difference signal, the selector 32 selects one of the outputs of the delay units $30_1$ through $30_N$ so as to eliminate the phase difference. The selected signal is supplied as the output clock signal from a pulse generator 36.

The PLL circuit of FIG. 1 is capable of generating a highly accurate clock signal, but requires a sophisticated control of the phase comparator 10, the voltage generator 14, and the VCO 16. Further, complexity of each circuit results in an undesirably large circuit volume. Analog control is susceptible to a change in temperature, so that a malfunction may occur when noise is introduced into the output signal of the voltage generator 14. A high level of skill is required to design a circuit which can eliminate such noise, thereby adding to the overall cost of the device.

The PLL device of FIG. 2 can maintain a circuit size thereof lower than that of the PLL circuit of FIG. 1, thereby providing a low cost PLL device. However, accuracy achieved by this device is not so high, and a phase displacement is generated in a relatively short period of time. In order to avoid this, the input signal needs to be provided with the synchronization bits at rather short intervals. In this case, a need to establish synchronism rather frequently leads to a degradation in a signal-transmission rate.

The PLL device of FIG. 3 needs a large number of delay units in order to achieve a higher accuracy than the PLL device of FIG. 2, thereby resulting in a large circuit volume. Further, the delay units are susceptible to a variation in delay lengths due to a variation in a process of making a semiconductor device. This gives rise to a problem that a macro structure is difficult to achieve.

Accordingly, there is a need for a PLL device which can reduce a design time, cost, and circuit size while being capable of coping with a wide range of a frequency variation of an input signal with a sufficient accuracy, and can avoid a degradation in a signal-transmission rate by avoiding insertion of synchronization bits into the input signal.

SUMMARY OF THE INVENTION

Accordingly, it is a general object of the present invention to provide a PLL device which can satisfy the need described above.

It is another and more specific object of the present invention to provide a PLL device which can reduce a design time, cost, and circuit size while being capable of coping with a wide range of a frequency variation of an input signal with a sufficient accuracy, and can avoid a degradation in a signal-transmission rate by avoiding insertion of synchronization bits into the input signal.

In order to achieve the above objects, a device according to the present invention includes a pulse-width-detection unit which detects pulse widths of an input signal supplied to said device, a pulse-width-information storing unit which stores the pulse widths detected by said pulse-width-detection unit, an operation unit which obtains indication information from the pulse widths stored in said pulse-width-information storing unit, and a pulse-generation unit which generates a pulse signal by delaying the input signal by a delay amount commensurate with the indication information, the pulse signal being supplied to an exterior of said device.

In this manner, a plurality of detected pulse widths are stored, and indication information is obtained based on the detected pulse widths, thereby generating the output pulse signal. Since every element of the device is implemented through a simple logic operation, a design time required for making of the device can be reduced. This results in a cost reduction as well as a relatively small circuit size. Further, the device is highly accurate, and is capable of coping with a broad range of frequency fluctuation of the input signal. No synchronization bits are inserted into the input signal, so that a degradation in a signal-transmission rate can be avoided.

According to one aspect of the present invention, the device as described above further includes an indicating unit which compares the indication information supplied from said operation unit with reference information representing correct indication information, said indicating unit supplying the indication information to said pulse-generation unit if the indication information is substantially the same as the reference information within a tolerable margin, and otherwise supplying the reference information to said pulse-generation unit as the indication information.

In the device described above, the indication information is compared with the reference information, and a pulse signal is generated based on the indication information when the indication information is substantially identical to the reference information within a tolerable error. This configuration further enhances the performance of the device in terms of accuracy as well as capacity to cope with a wide range of frequency fluctuation of the input signal.

According to another aspect of the present invention, the device as described above is such that the reference information is externally supplied to said device.

According to another aspect of the present invention, the device as described above is such that the reference information is obtained based on pieces of the indication information previously obtained by said operation unit.

In the device described above, there is no need to provide the reference signal for the device from the exterior of the device.

According to another aspect of the present invention, the device as described first further includes an indicating unit which compares a pulse width supplied from said pulse-width-detection unit with reference information representing correct pulse width, said indicating unit supplying the indication information to said pulse-generation unit if the pulse width is substantially the same as the reference information within a tolerable margin, and otherwise supplying the reference information to said pulse-generation unit as the indication information.

In this manner, the detected pulse width supplied from the pulse-width-detection unit, rather than the indication information, is compared with the reference information corresponding to a correct pulse width, and the output pulse is generated from the indication information when the detected pulse width is substantially the same as the reference information within a tolerable range. This configuration achieves a high accuracy and provides a capacity to cope with a broad range of frequency fluctuation of the input signal.

According to another aspect of the present invention, the device as described first further includes an indicating unit which compares a pulse width read from said pulse-width-information storing unit with reference information representing correct pulse width, said indicating unit supplying the indication information to said pulse-generation unit if the pulse width is substantially the same as the reference information within a tolerable margin, and otherwise supplying the reference information to said pulse-generation unit as the indication information.

In this manner, the pulse width read from the pulse-width-information storing unit, rather than the indication information, is compared with the reference information corresponding to a correct pulse width, and the output pulse is generated from the indication information when the pulse width is substantially the same as the reference information within a tolerable range. This configuration achieves a high accuracy and provides a capacity to cope with a broad range of frequency fluctuation of the input signal.

According to another aspect of the present invention, the device as described first is such that said pulse-generation unit includes a coarse adjustment unit which makes a coarse adjustment to the delay of the pulse signal by delaying the input signal by a delay amount commensurate with upper bits of the indication information, and a fine adjustment unit which makes a fine adjustment to the delay of the pulse signal by delaying an output from said coarse adjustment unit by a delay amount commensurate with lower bits of the indication information.

In this manner, the coarse adjustment as to the delay of the pulse signal is performed base on the upper bits of the indication information, and, then, the fine adjustment is made by using the lower bits of the indication information. This configuration helps in reducing a circuit size.

According to another aspect of the present invention, the device as described first is such that the device is implemented as a digital circuit.

Use of digital circuits results in lesser susceptibility to noise and lesser chance of malfunction.

According to another aspect of the present invention, the device as described first is such that the device is implemented as an analog circuit.

Other objects and further features of the present invention will be apparent from the following detailed description when read in conjunction with the accompanying drawings.

BRIEF DESCRIPTION OF THE DRAWINGS

FIG. 1 is a block diagram showing a configuration of a related-art PLL device;

FIGS. 6A through 6R are timing charts showing operations of the PLL device according to the first embodiment;

FIGS. 8A through 8H are timing charts showing operations of the PLL device according to the second embodiment;

FIG. 9 is a block diagram showing a configuration of a third embodiment of the PLL device according to the present invention;

DESCRIPTION OF THE PREFERRED EMBODIMENTS

In the following, embodiments of the present invention will be described with reference to the accompanying drawings.

Figure 2:
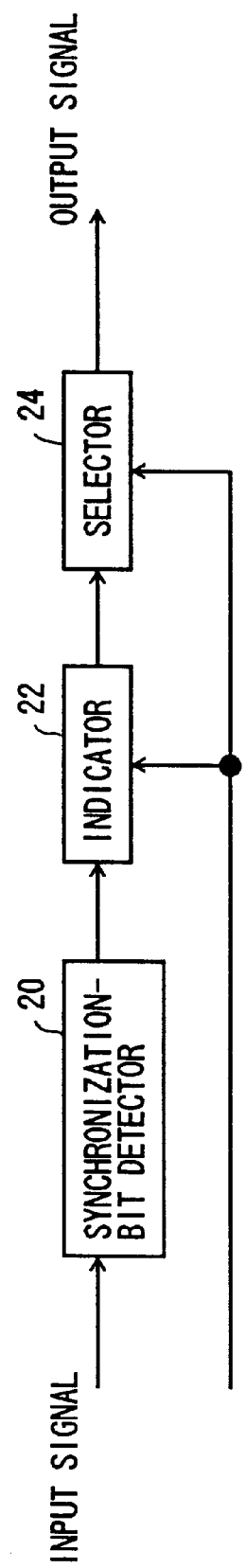
FIG. 2 is a block diagram showing another configuration of a related-art PLL device.
Figure 3:
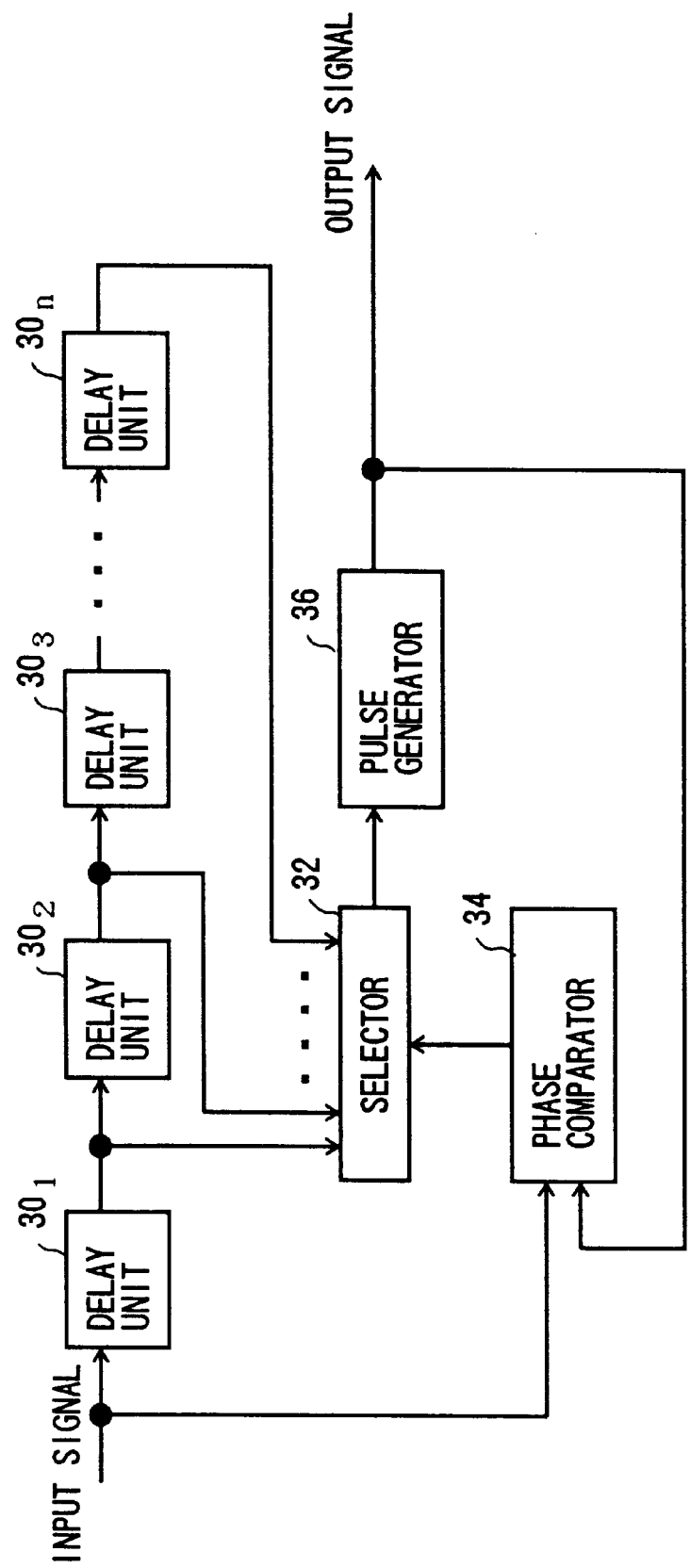
FIG. 3 is a block diagram showing yet another configuration of a related-art PLL device.
Figure 4:
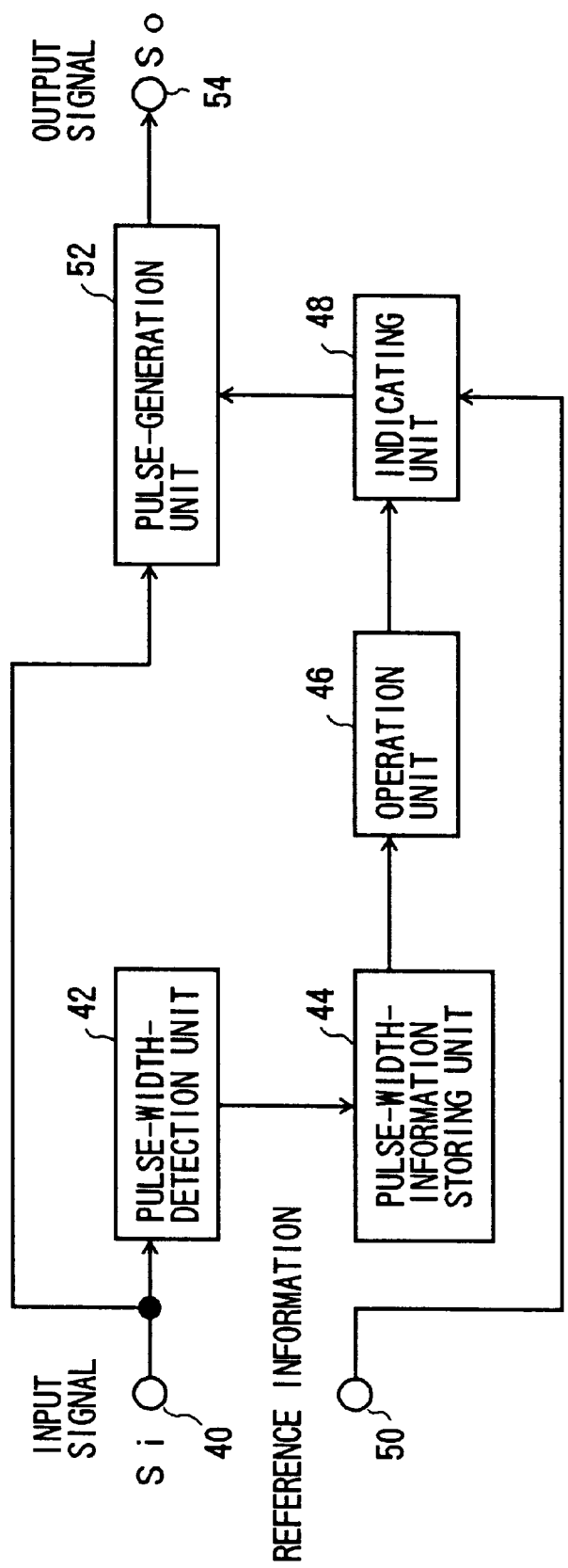
FIG. 4 is a block diagram showing a first embodiment of a PLL device according to the present invention.

FIG. 4 is a block diagram showing a first embodiment of a PLL device according to the present invention.

In FIG. 4, a pulse-width-detection unit 42 receives an input signal Si supplied to a node 40. The pulse-width-detection unit 42 detects pulse widths of the pulses of the input signal Si, and stores the detected pulse widths in a pulse-width-information storing unit 44. An operation unit 46 obtains an average of the pulse widths stored in the pulse-width-information storing unit 44, and further obtains indication information from the obtained average so that the indication information is to be used for establishing phase synchronization with the input signal Si. The indication information is then supplied to an indicating unit 48.

The indicating unit 48 compares the indication information supplied from the operation unit 46 with reference information supplied from a node 50 where the reference information represents correct indication information. If the indication information differs from the reference information by an error smaller than a predetermined tolerance margin, the indicating unit 48 supplies the indication information to a pulse-generation unit 52. If the indication information differs from the reference information by an error larger than the predetermined tolerance margin, the indicating unit 48 supplies the reference information to the pulse-generation unit 52 as the indication information. The pulse-generation unit 52 generates a clock signal by delaying the input signal Si supplied from the node 40 by a delay amount commensurate with the indication information, and supplies the clock signal as an output signal from a node 54.

Figures 5, 5A:
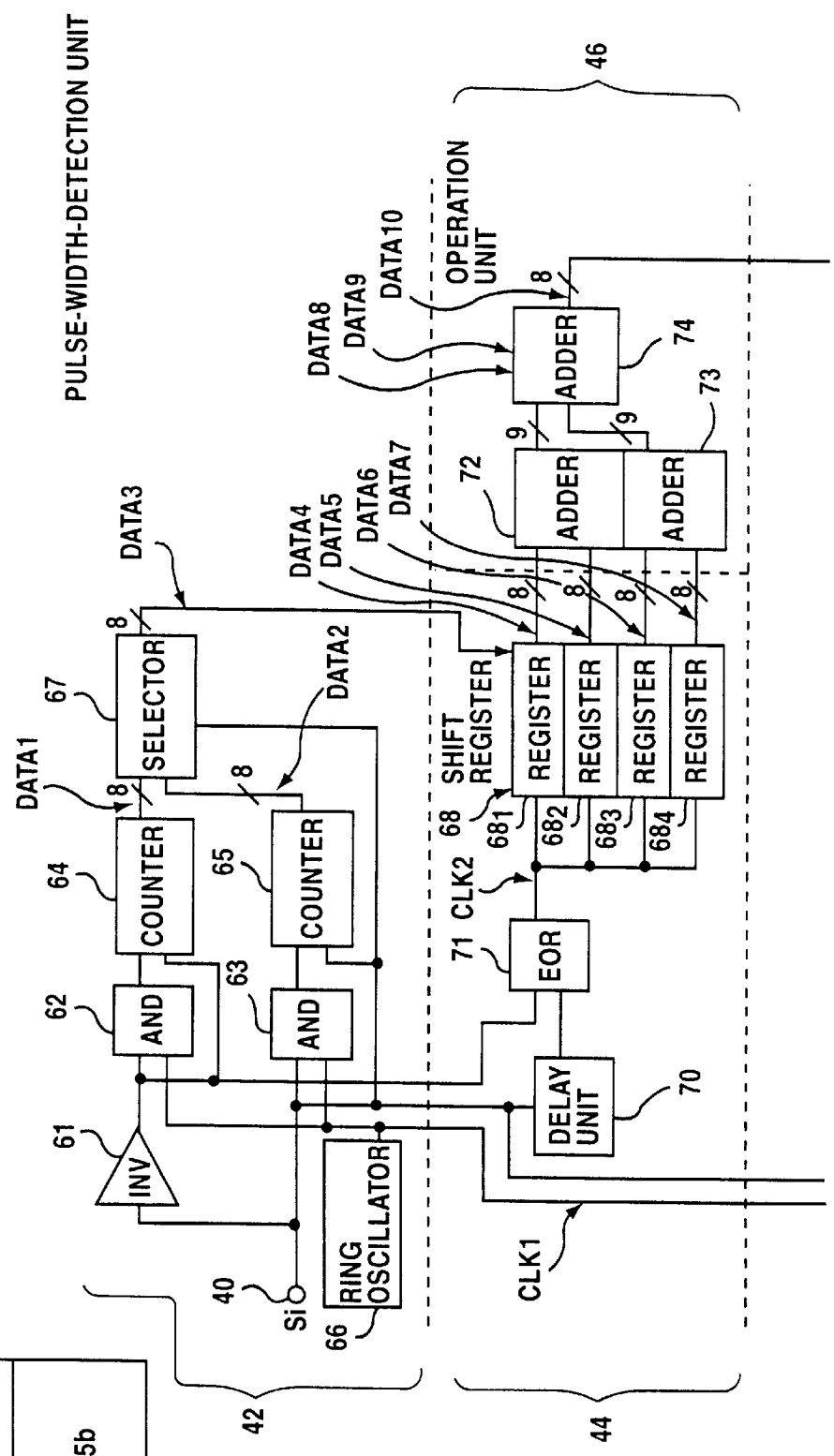
FIG. 5 is a block diagram showing a detailed configuration of the first embodiment of the PLL device according to the present invention.
Figure 5B:
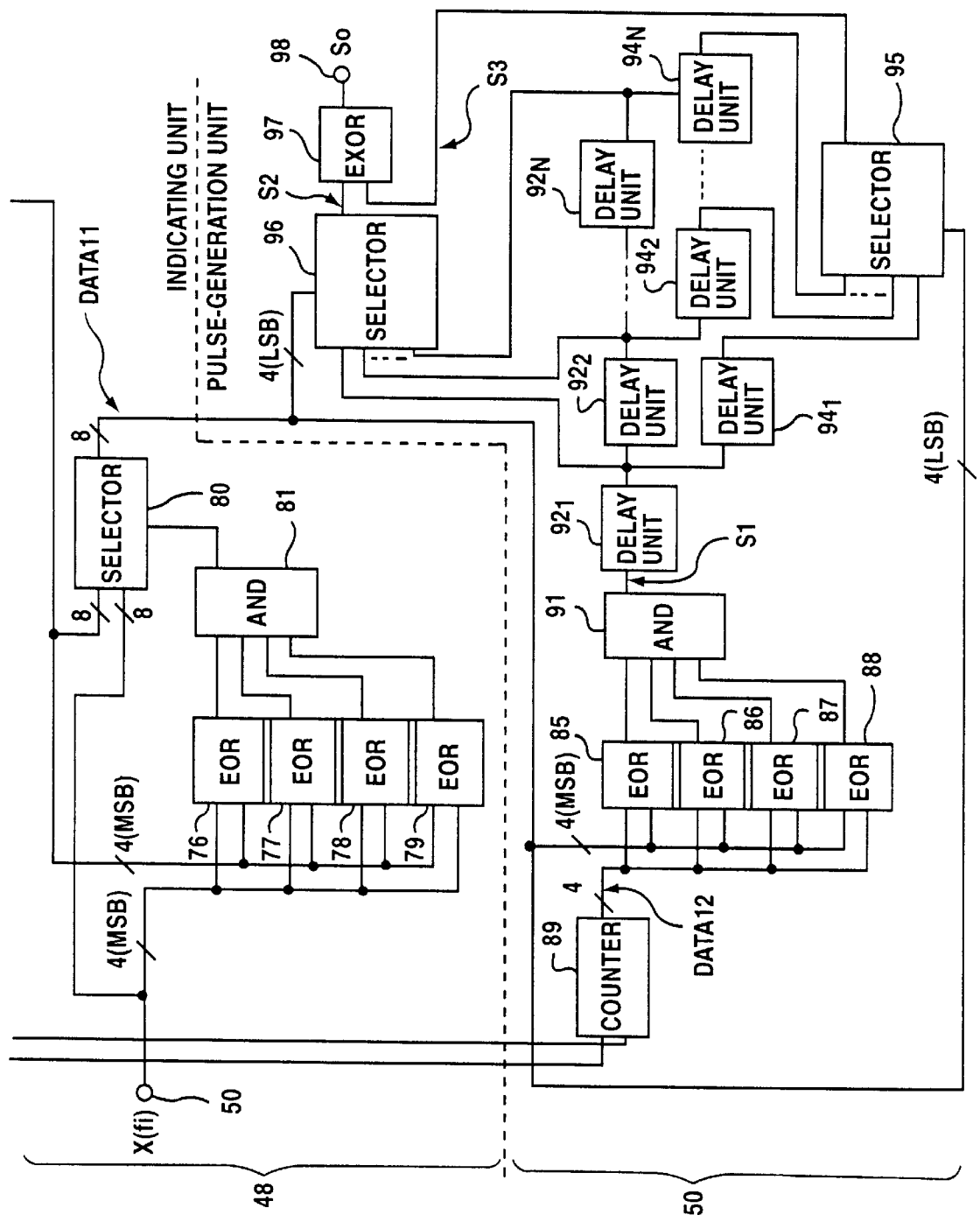

FIG. 5 is a block diagram showing a detailed configuration of the first embodiment of the PLL device according to the present invention. FIGS. 6A through 6R are timing charts showing operations of the PLL device according to the present invention.

In FIG. 5, the input signal Si supplied to the node 40 as shown in FIGS. 6A and 6C is provided to an AND circuit 63 of the pulse-width-detection unit 42, and, also, is provided to an AND circuit 62 after being inverted by an inverter 61. Here, FIG. 6C shows an enlarged signal form of the input signal Si shown in FIG. 6A.

The AND circuits 62 and 63 respectively receive a system clock signal CLK1 from a ring oscillator 66. The AND circuits 63 and 62 respectively extract edge signals from the input signal Si and an inverse thereof in synchronism with the system clock signal CLK1, and supply the edge signals to counters 65 and 64, respectively. Here, the system clock signal CLK1 has a frequency which is 128 times as high as that of the input signal Si.

The counter 64 is an 8-bit counter, for example, and counts a length of a low-level period of the input signal Si by using the system clock signal CLK1. The counter 65 is also an 8-bit counter, for example, and counts a length of a high-level period of the input signal Si by using the system clock signal CLK1. The counters 64 and 65 output the counts (pulse widths) DATA1 and DATA2 as shown in FIGS. 6D and 6E, respectively, which are supplied to a selector 67. The selector 67 selects either the count DATA1 or the count DATA2 in accordance with the signal levels of the input signal Si, and outputs counts DATA3 as shown in FIG. 6F, which is supplied to a shift register 68 of the operation unit 46.

An exclusive OR circuit 71 receives the inverse of the input signal Si output from the inverter 61 and a delayed input signal Si delayed by a delay unit 70, and obtains an edge-detection signal CLK2 shown in FIG. 6G. The edge-detection signal CLK2 is supplied to registers $68_1$ through $68_4$ together forming the shift register 68. This makes it possible to successively shift the counts DATA3 in the registers $68_1$ through $68_4$ in synchronism with the edge-detection signal CLK2 when the counts DATA3 is supplied from the selector 67.

The registers $68_1$ and $68_2$ store 8-bit values DATA4 and DATA5, respectively, as shown in FIGS. 6H and 6I. The 8-bit values DATA4 and DATA5 are added together by an adder 72, and a resulting 9-bit value is supplied to an adder 74. The registers $68_3$ and $68_4$ store 8-bit values DATA6 and DATA7, respectively, as shown in FIGS. 6J and 6K. The 8-bit values DATA6 and DATA7 are added together by an adder 73, and a resulting 9-bit value is supplied to the adder 74. The adder 74 adds the two values together, and obtains a 10-bit sum as shown in FIG. 6L. Then, the three least significant bits are discarded (FIG. 6M), and only 8 upper bits of the 10-bit sum are output as shown in FIG. 6N. Namely, an average is obtained with regard to the lengths of the high-level periods and the low-level periods over a two cycle period of the input signal Si, and, then, a half of the average is output as indication information indicative of a midpoint. Upper four bits of the midpoint value are respectively supplied to exclusive OR circuits 76 through 79 of the indicating unit 48, and the midpoint value per se is supplied to a selector 80.

The 4-bit reference information supplied to the node 50 represents a correct midpoint value. Upper four bits of the reference information are respectively supplied to the exclusive OR circuits 76 through 79, where the upper four bits of the midpoint value and the upper four bits of the reference information are compared. Output signals of the exclusive OR circuits 76 through 79 are supplied to an AND circuit 81. When the upper four bits are identical between the midpoint value and the reference information, the AND circuit 81 supplies a high-level signal to the selector 80. When receiving the high-level signal from the AND circuit 81, the selector 80 selects the 8-bit midpoint value since the midpoint value falls within a predetermined tolerable range around the reference information. When receiving the low-level signal from the AND circuit 81, the selector 80 selects the 8-bit reference information since the midpoint value differs from the reference information by more than a predetermined tolerable margin.

The upper four bits of the 8-bit value output from the selector 80, as shown in FIG. 6O, are respectively supplied to one input of exclusive OR circuits 85 through 88 of the pulse-generation unit 52. A counter 89 supplying signals to the other input of the exclusive OR circuits 85 through 88 is a 4-bit counter, for example. The counter 89 is reset by an edge of the input signal Si, and thereafter counts the system clock signal CLK1 to generate a 4-bit count as shown in FIG. 6P. The 4 bits of the count are supplied to the exclusive OR circuits 85 through 88 in a bit-wise manner.

The exclusive OR circuits 85 through 88 compare the upper four bits of the output of the selector 80 with the four bits of the 4-bit count. An AND circuit 91 receiving outputs from the exclusive OR circuits 85 through 88 generates a signal S1 that becomes a high level when there is a match between the two sets of four bits compared with each other. The signal S1 is shown in FIG. 6Q. This signal S1 is delayed behind an edge of the input signal Si by a period equivalent to the upper four bits of the output of the selector 80 when this period is counted by a number of cycles of the system clock signal CLK1. This achieves a coarse adjustment of the output clock. The signal S1 is supplied to delay units $92_1$ through $92_1$ N connected in series so as to successively experience respective delays. Outputs of the delay units $92_1$ through $92_N$ are supplied to a selector 96. Further, the outputs of the delay units $92_1$ through $92_N$ are respectively delayed by delay units $94_1$ through $94_N$ before they are supplied to a selector 95.

The selector 96 also receives the lower four bits of the 8-bit value (FIG. 6O) output from the selector 80, and selects one of the outputs of the delay units $92_1$ through $92_N$ in accordance with the received lower four bits, thereby effecting a fine adjustment. An output of the selector 96 is supplied to an exclusive OR circuit 97. The selector 95 also receives the lower four bits of the 8-bit value (FIG. 6O) output from the selector 80, and selects one of the outputs of the delay units $94_1$ through $94_N$ in accordance with the received lower four bits. An output of the selector 95 is supplied to the exclusive OR circuit 97. The output of the selector 95 is delayed behind the output of the selector 96 by a delay amount equivalent to one delay unit. The exclusive OR circuit 97 generates the clock signal So as shown in FIG. 6R, and supplies the same to a node 98. The output clock signal So corresponding to the input signal Si of FIG. 6A is shown in FIG. 6B.

In this manner, a plurality of detected pulse widths are stored, and indication information is obtained based on the detected pulse widths, thereby generating the output pulse signal. Since every element of the device is implemented through a simple logic operation, a design time required for making of the device can be reduced. This results in a cost reduction as well as a relatively small circuit size. Further, the device is highly accurate, and is capable of coping with a broad range of frequency fluctuation of the input signal, contrasting with the related-art device which uses a VCO. No synchronization bits are inserted into the input signal, so that a degradation in a signal-transmission rate can be avoided. Further, the indication information is compared with the reference information, and a pulse signal is generated based on the indication information when the indication information is substantially identical to the reference information within a tolerable error. This configuration further enhances the performance of the device in terms of accuracy as well as capacity to cope with a wide range of frequency fluctuation.

Figure 7B:
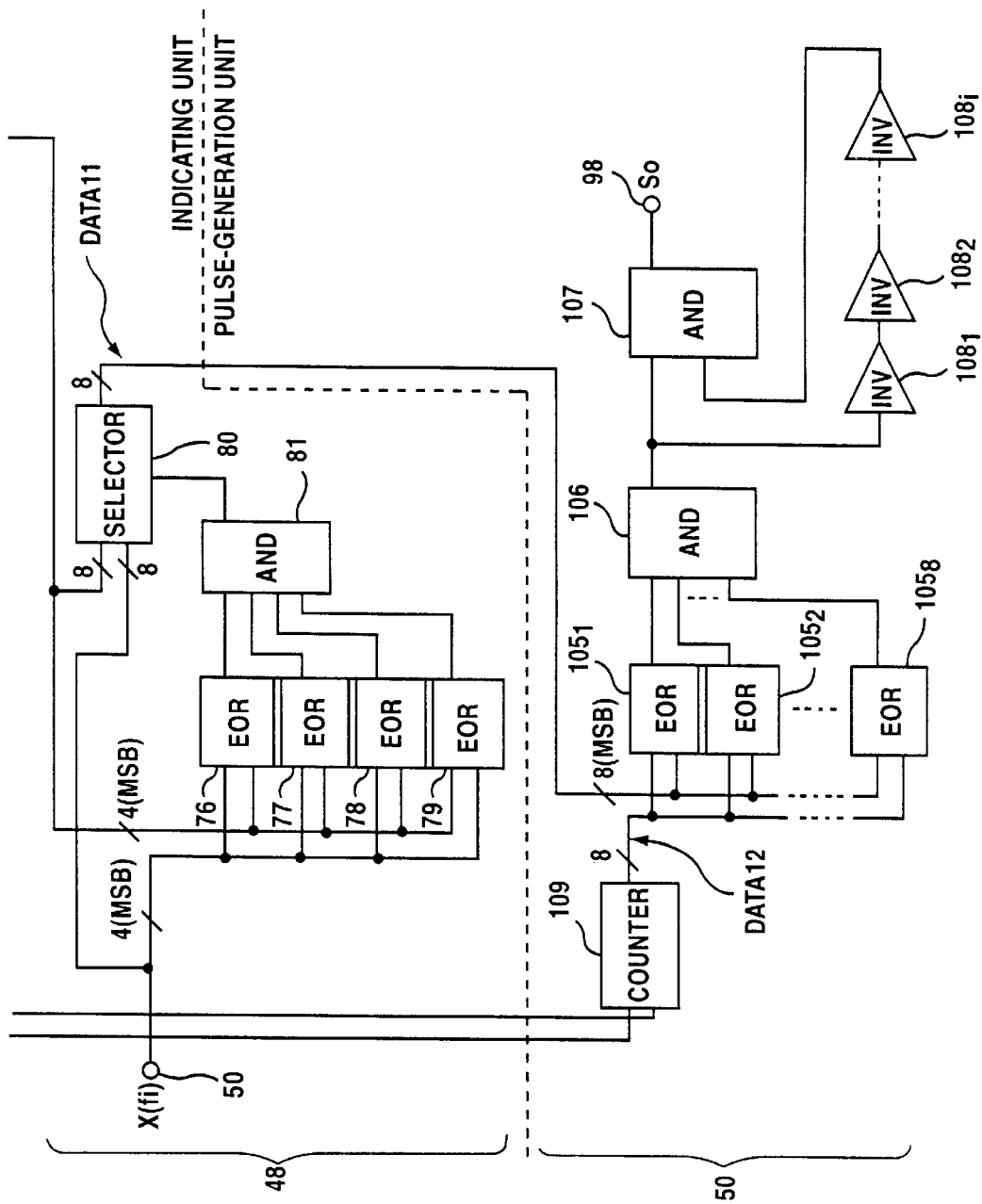
FIG. 7 is a block diagram showing a detailed configuration of a second embodiment of the PLL device according to the present invention.

FIG. 7 is a block diagram showing a detailed configuration of a second embodiment of the PLL device according to the present invention. FIGS. 8A through 6H are timing charts showing operations of the PLL device according to the second embodiment.

In FIG. 7, the same elements as those of FIG. 5 are referred to by the same numerals, and a description thereof will be omitted.

In FIG. 7, the input signal Si supplied to the node 40 as shown in FIGS. 8A and 8C is provided to the AND circuit 63 of the pulse-width-detection unit 42, and, also, is provided to the AND circuit 62 after being inverted by the inverter 61. Here, FIG. 8C shows an enlarged signal form of the input signal Si shown in FIG. 8A.

The AND circuits 62 and 63 respectively receive the system clock signal CLK1 from the ring oscillator 66. The AND circuits 63 and 62 respectively extract edge signals from the input signal Si and the inverse thereof in synchronism with the system clock signal CLK1, and supply the edge signals to counters 65 and 64, respectively. Here, the system clock signal CLK1 has a frequency which is 128 times as high as that of the input signal Si.

The counter 64 is an 8-bit counter, for example, and counts a length of a low-level period of the input signal Si by using the system clock signal CLK1. The counter 65 is also an 8-bit counter, for example, and counts a length of a high-level period of the input signal Si by using the system clock signal CLK1. The counters 64 and 65 output the counts (pulse widths) DATA1 and DATA2 as shown in FIGS. 8D and 8E, respectively, which are supplied to the selector 67. The selector 67 selects either the count DATA1 or the count DATA2 in accordance with the signal levels of the input signal Si, and outputs counts DATA3 as shown in FIG. 8F, which is supplied to the shift register 68 of the operation unit 46.

The exclusive OR circuit 71 receives the inverse of the input signal Si output from the inverter 61 and the delayed input signal Si delayed by the delay unit 70, and obtains the edge-detection signal CLK2. The edge-detection signal CLK2 is supplied to the registers $68_1$ through $68_4$ together forming the shift register 68. This makes it possible to successively shift the counts DATA3 in the registers $68_1$ through $68_4$ in synchronism with the edge-detection signal CLK2 when the counts DATA3 is supplied from the selector 67.

The registers $68_1$ and $68_2$ store 8-bit values DATA4 and DATA5, respectively. The 8-bit values DATA4 and DATA5 are added together by the adder 72, and a resulting 9-bit value is supplied to the adder 74. The registers $68_3$ and $68_4$ store 8-bit values DATA6 and DATA7, respectively. The 8-bit values DATA6 and DATA7 are added together by the adder 73, and a resulting 9-bit value is supplied to the adder 74. The adder 74 adds the two values together, and obtains the 10-bit sum. Then, the three least significant bits are discarded, and only 8 upper bits of the 10-bit sum are output. Namely, an average is obtained with regard to the lengths of the high-level periods and the low-level periods over a two cycle period of the input signal Si, and, then, a half of the average is output as indication information indicative of a midpoint. Upper four bits of the midpoint value are respectively supplied to the exclusive OR circuits 76 through 79 of the indicating unit 48, and the midpoint value per se is supplied to the selector 80.

The 4-bit reference information supplied to the node 50 represents a correct midpoint value. Upper four bits of the reference information are respectively supplied to the exclusive OR circuits 76 through 79, where the upper four bits of the midpoint value and the upper four bits of the reference information are compared. Output signals of the exclusive OR circuits 76 through 79 are supplied to the AND circuit 81. When the upper four bits are identical between the midpoint value and the reference information, the AND circuit 81 supplies a high-level signal to the selector 80. When receiving the high-level signal from the AND circuit 81, the selector 80 selects the 8-bit midpoint value since the midpoint value falls within a predetermined tolerable range around the reference information. When receiving the low-level signal from the AND circuit 81, the selector 80 selects the 8-bit reference information since the midpoint value differs from the reference information by more than a predetermined tolerable margin.

Since the counters 64 and 65 are 8-bit counters, the counts of the counters 64 and 65 reach a maximum count thereof, i.e., 255, as shown in FIG. 8E if there is no edge in the input signal Si and if a straightforward configuration is employed. In this configuration, however, the indicating unit 48 replace such a maximum count with a reference value.

The 8 bits output from the selector 80 are from the selector 80, as shown in FIG. 6O, are respectively supplied to one input of exclusive OR circuits $105_1$ through $105_8$ of the pulse-generation unit 52. A counter 109 supplying signals to the other input of the exclusive OR circuits $105_1$ through $105_8$ is an 8-bit counter, for example. The counter 109 is reset by an edge of the input signal Si shown in FIG. 8G, and thereafter counts the system clock signal CLK1 (FIG. 8H) to generate an 8-bit count. The eight bits of the count are supplied to the exclusive OR circuits $105_1$ through $105_8$ in a bit-wise manner.

The exclusive OR circuits $105_1$ through $105_8$ compare the eight bits of the output of the selector 80 with the eight bits of the 8-bit count. An AND circuit 106 receiving outputs from the exclusive OR circuits $105_1$ through $105_8$ generates a signal S1 that becomes a high level when there is a match between the two sets of eight bits compared with each other. This signal S1 is delayed behind an edge of the input signal Si by a period equivalent to the eight bits of the output of the selector 80 when this period is counted in terms of a number of cycles of the system clock signal CLK1. This achieves a coarse adjustment and a fine adjustment of the output clock. The signal S1 is supplied to an AND circuit 107, and, also, is supplied to an odd number of inverters $108_1$ through $108_i$ connected in series so as to successively experience respective delays. An output of the inverter $108_i$, which is inverted and delayed relative the output of the AND circuit 106, is supplied to the AND circuit 107. In this manner, the AND circuit 107 generates a clock signal having a pulse width corresponding to a total delay time of the inverters $108_1$ through $108_i$, and outputs the same from the node 98 as the output clock signal So shown in FIG. 8B.

The devices of the first and second embodiments are implemented as digital circuits. Notwithstanding this, the present invention may be implemented as an analog circuit as will be described in the following.

FIG. 9 is a block diagram showing a configuration of a third embodiment of the PLL device according to the present invention. In FIG. 9, the same elements as those of FIG. 5 are referred to by the same numerals, and a description thereof will be omitted.

In FIG. 9, the input signal Si supplied to the node 40 is provided to a charge pump 110 of the pulse-width-detection unit 42, and, also, is directed to a charge pump 114 after being inverted by an inverse-signal-generation circuit 112. The charge pump 110 finishes an electrical discharge of a capacitor during a low-level period of the input signal Si, and charge electricity during a high-level period thereof. A voltage level $V_1$ thus charged is supplied to a switch circuit 118. The charge pump 114 completes an electrical discharge of a capacitor during a high-level period of the input signal Si, and charge up a voltage during a low-level period thereof. A voltage level $V_2$ charged by the charge pump 114 is then supplied to the switch circuit 118.

A switch-signal-generation circuit 116 generates a switch signal SW based on the input signal Si and an inverse thereof, and supplies the same to the switch circuit 118. The switch circuit 118 supplies the voltage level $V_1$ output from the charge pump 110 to a shifter 120 at a falling edge of the input signal Si, and supplies the voltage level $V_2$ output from the charge pump 114 to the shifter 120 at a rising edge of the input signal Si. The shifter 120 successively changes a destination of a voltage level $V_3$ output from the switch circuit 118 among charge pumps 121 through 124 in accordance with the switch signal SW in synchronism with rising and falling edges of the input signal Si. The charge pumps 121 through 124 keep the supplied voltages $V_4$ through $V_7$, respectively, and provide these voltages to a summation circuit 126 of the operation unit 46.

The summation circuit 126 adds together the voltages supplied from the charge pumps 121 through 124, and an added voltage $V_8$ is divided into ⅛ the voltage by a potential divider 128 comprised of resisters. Then, a voltage level $V_9$ corresponding to one half of the average of the pulse widths is supplied to a switch circuit 130, a non-inverted-input node of a comparator 132, and an inverted-input node of a comparator 134 of the indicating unit 48. A potential divider 136 comprised of resistors divides a reference voltage $V_{ref}$ corresponding to an ideal pulse width when the reference voltage $V_{ref}$ is supplied from a node 137. Via the potential division, the potential divider 136 provides a voltage Va ($=V_{ref}\times¾$) to an inverted-input node of the comparator 132 as a reference, and, also, supplies a voltage Vb ($=V_{ref}/4$) to a summation circuit 138. The summation circuit 138 adds the voltage Vb and the reference voltage $V_{ref}$ together to generate a voltage Vc ($=V_{ref}\times5/4$), which is supplied to a non-inverted-input node of the comparator 134.

The comparator 132 compares the voltage $V_9$ with the voltage Va which represents the ideal pulse width plus 25%, and generates a switch-control signal to be supplied to a switch circuit 130. The comparator 134 compares the voltage $V_9$ with the voltage Vb which represents the ideal pulse width minus 25%, and generates a switch-control signal to be supplied to a switch circuit 140. Only when the respective switch-control signals are at a high level, do the switch circuits 130 and 140 open. An output of the switch circuit 130 is supplied to the switch circuit 140, and an output of the switch circuit 140 is supplied to a non-inverted-input node of a comparator 142. In this manner, the voltage $V_9$ corresponding to one half of the average of the pulse width is input to the non-inverted-input node of the comparator 142 as a reference voltage when the voltage $V_9$ falls within a range between the voltage Va and the voltage Vb.

The inverted-input node of the comparator 142 receives the voltage $V_3$. The comparator 142 generates a clock signal which becomes high when the voltage $V_3$ is smaller than the reference voltage, and supplies the clock signal to the node 54 as an output. A constant-current-supply circuit 144 shown in the figure supplies a constant electric current to the charge pumps 110, 114, and 121 through 124.

This embodiment can implement a highly accurate PLL device, and what needs to be done in this regard is only to make appropriate settings to the amounts of currents supplied to the charge pumps 110, 114, and 121 through 124 and insure an appropriate match with regard to the reference voltage $V_{ref}$. The comparators are relatively bulky in terms of circuit size. However, only three of them are provided in this embodiment, and, thus, a required circuit size is much smaller than that of the related art. Further, since no VCO is employed, the device of this embodiment can cope with a broad range of frequency fluctuation of the input signal.

Figure 10:
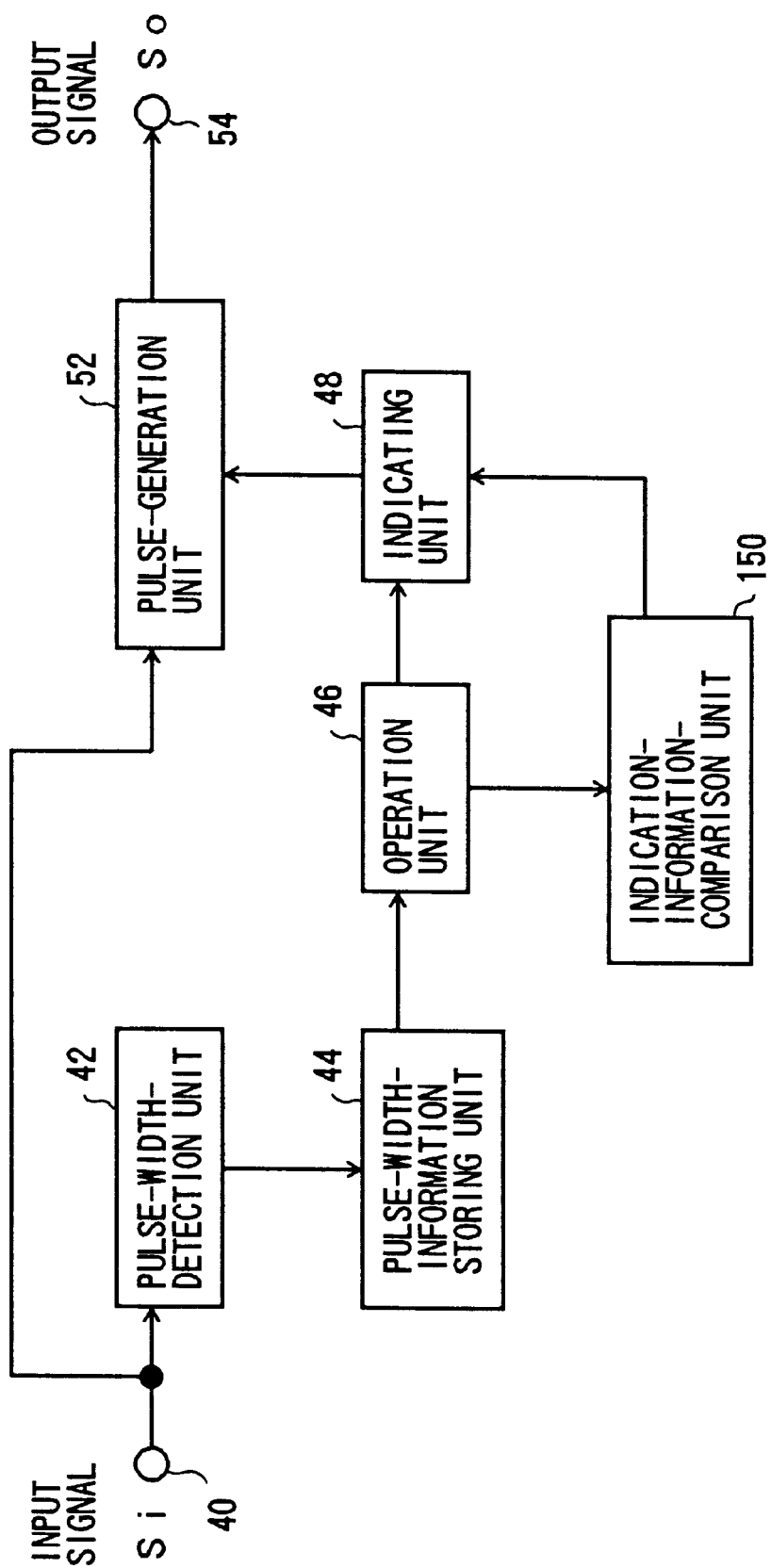
FIG. 10 is a functional block diagram showing a fourth embodiment of the PLL device according to the present invention.

FIG. 10 is a functional block diagram showing a fourth embodiment of the PLL device according to the present invention. In FIG. 10, the same elements as those of FIG. 4 are referred to by the same numerals, and a description thereof will be omitted.

In FIG. 10, the input signal Si input to the node 40 is supplied to the pulse-width-detection unit 42. The pulse-width-detection unit 42 detects pulse widths of the pulses of the input signal Si, and stores the detected pulse widths in the pulse-width-information storing unit 44. The operation unit 46 obtains an average of the pulse widths stored in the pulse-width-information storing unit 44, and further obtains indication information from the obtained average so that the indication information is to be used for establishing phase synchronization with the input signal Si. The indication information is then supplied to the indicating unit 48 and an indication-information-comparison unit 150.

The indication-information-comparison unit 150 identifies appropriate indication information among pieces of indication information previously supplied from the operation unit 46, and supplies the identified indication information as reference information to the indicating unit 48. The indicating unit 48 compares the indication information supplied from the operation unit 46 with the reference information supplied from the indication-information-comparison unit 150. If the indication information differs from the reference information by an error smaller than a predetermined tolerance margin, the indicating unit 48 supplies the indication information to the pulse-generation unit 52. If the indication information differs from the reference information by an error larger than the predetermined tolerance margin, the indicating unit 48 supplies the reference information to the pulse-generation unit 52 as the indication information. The pulse-generation unit 52 generates a clock signal by delaying the input signal Si supplied from the node 40 by a delay amount commensurate with the indication information, and supplies the clock signal as an output signal to the node 54. In this embodiment, there is no need to supply the reference information from an exterior of the device.

Figure 11:
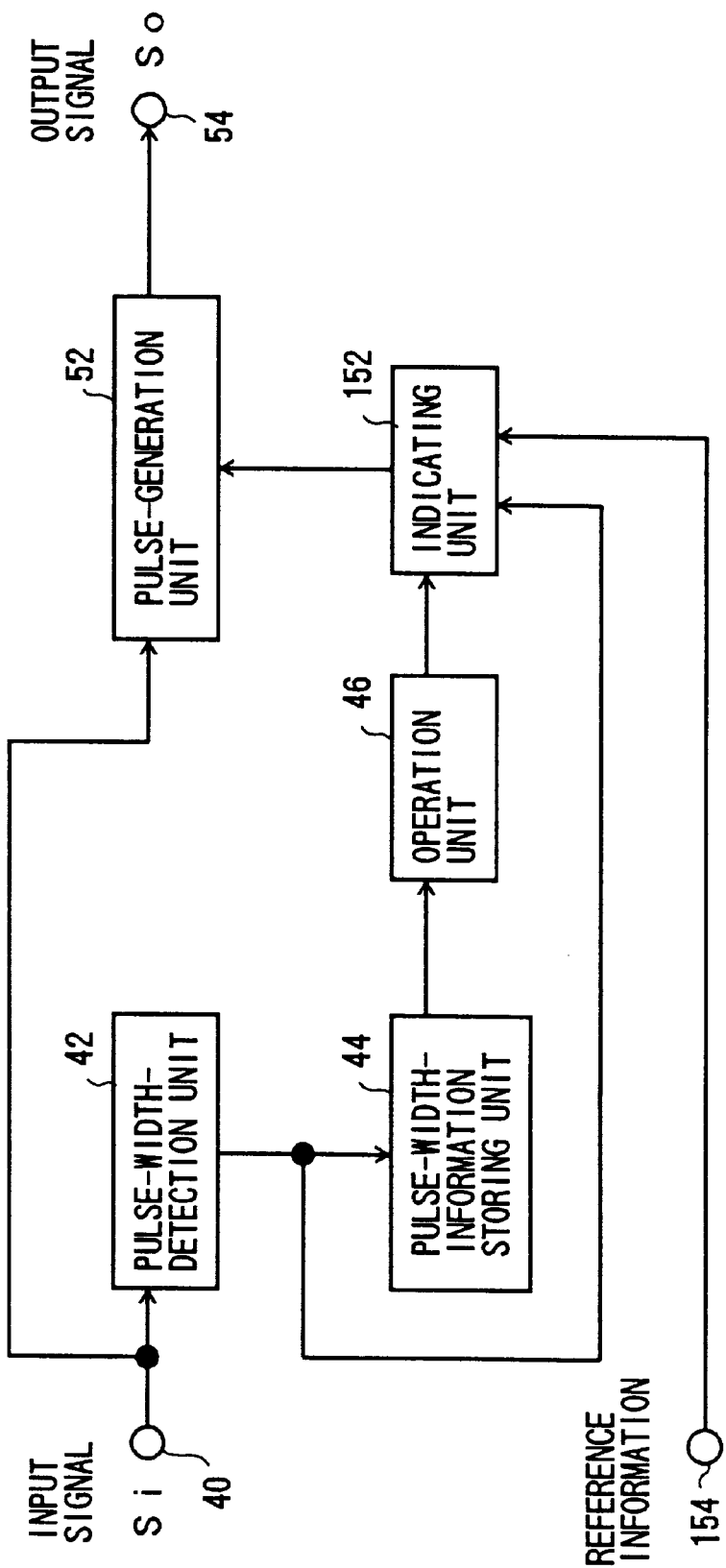
FIG. 11 is a functional block diagram showing a fifth embodiment of the PLL device according to the present invention.

FIG. 11 is a functional block diagram showing a fifth embodiment of the PLL device according to the present invention. In FIG. 11, the same elements as those of FIG. 4 are referred to by the same numerals, and a description thereof will be omitted.

In FIG. 11, the input signal Si input to the node 40 is supplied to the pulse-width-detection unit 42. The pulse-width-detection unit 42 detects pulse widths of the pulses of the input signal Si, and stores the detected pulse widths in the pulse-width-information storing unit 44. The pulse-width-detection unit 42 further supplies the detected pulse widths to an indicating unit 152. The operation unit 46 obtains an average of the pulse widths stored in the pulse-width-information storing unit 44, and further obtains indication information from the obtained average so that the indication information is to be used for establishing phase synchronization with the input signal Si. The indication information is then supplied to the indicating unit 48.

The indicating unit 152 compares a detected pulse width supplied from the pulse-width-detection unit 42 with reference information supplied from a node 154 where the reference information represents an appropriate pulse width. If the detected pulse width differs from the reference information by an error smaller than a predetermined tolerance margin, the indicating unit 48 supplies the indication information from the operation unit 46 to the pulse-generation unit 52. If the detected pulse width differs from the reference information by an error larger than the predetermined tolerance margin, the indicating unit 48 supplies the reference information to the pulse-generation unit 52 as the indication information. The pulse-generation unit 52 generates a clock signal by delaying the input signal Si supplied from the node 40 by a delay amount commensurate with the indication information, and supplies the clock signal as an output signal to the node 54.

In this manner, the detected pulse width supplied from the pulse-width-detection unit 42, rather than the indication information, is compared with the reference information corresponding to a correct pulse width, and the output pulse is generated from the indication information when the detected pulse width is substantially the same as the reference information within a tolerable range. This configuration achieves a high accuracy and provides a capacity to cope with a broad range of frequency fluctuation of the input signal.

Figure 12:
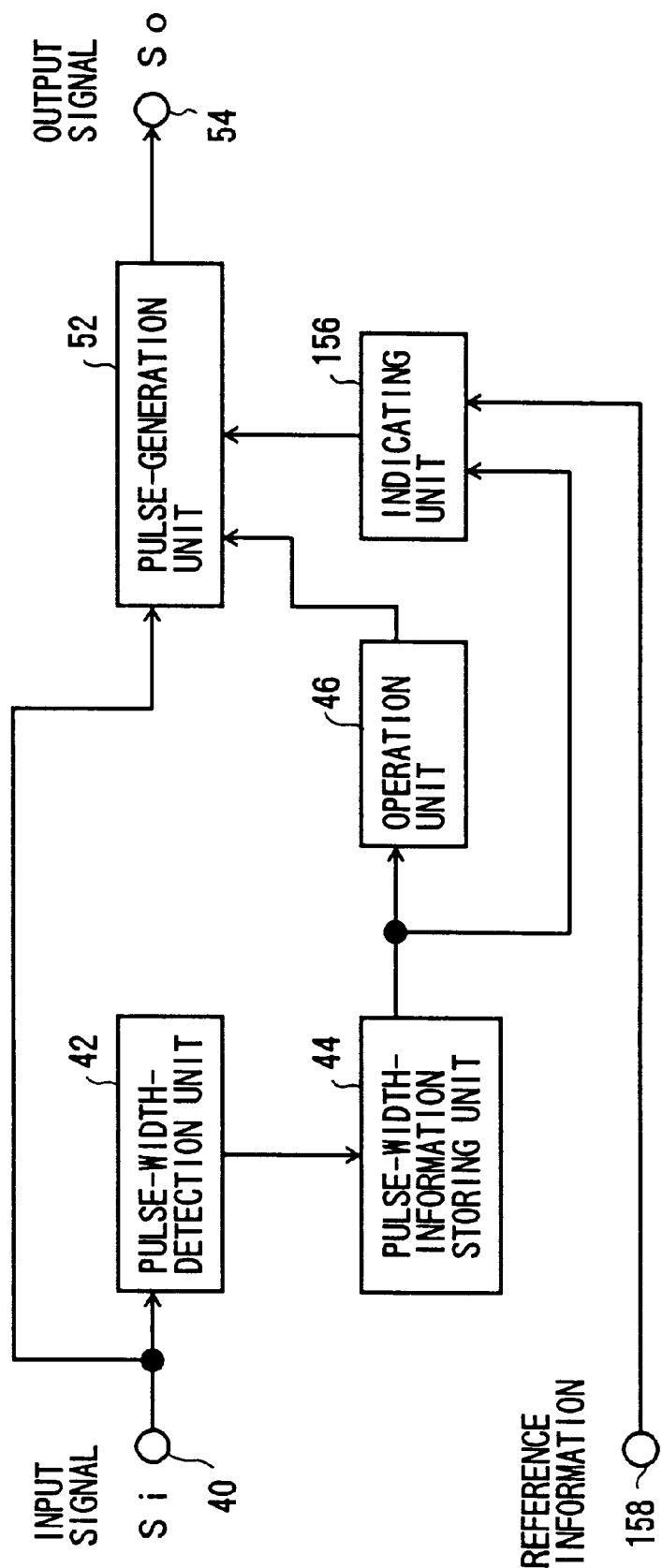
FIG. 12 is a functional block diagram showing a sixth embodiment of the PLL device according to the present invention.

FIG. 12 is a functional block diagram showing a sixth embodiment of the PLL device according to the present invention. In FIG. 12, the same elements as those of FIG. 4 are referred to by the same numerals, and a description thereof will be omitted.

In FIG. 12, the input signal Si input to the node 40 is supplied to the pulse-width-detection unit 42. The pulse-width-detection unit 42 detects pulse widths of the pulses of the input signal Si, and stores the detected pulse widths in the pulse-width-information storing unit 44. The operation unit 46 obtains an average of the pulse widths stored in the pulse-width-information storing unit 44, and further obtains indication information from the obtained average so that the indication information is to be used for establishing phase synchronization with the input signal Si. The indication information is then supplied to an indicating unit 156.

The indicating unit 156 compares a pulse width read from the pulse-width-information storing unit 44 with reference information supplied from a node 158 where the reference information represents an appropriate pulse width. If the pulse width differs from the reference information by an error smaller than a predetermined tolerance margin, the indicating unit 156 supplies the indication information from the operation unit 46 to the pulse-generation unit 52. If the pulse width differs from the reference information by an error larger than the predetermined tolerance margin, the indicating unit 156 supplies the reference information to the pulse-generation unit 52 as the indication information. The pulse-generation unit 52 generates a clock signal by delaying the input signal Si supplied from the node 40 by a delay amount commensurate with the indication information, and supplies the clock signal as an output signal to the node 54.

In this manner, the pulse width read from the pulse-width-information storing unit 44, rather than the indication information, is compared with the reference information corresponding to a correct pulse width, and the output pulse is generated from the indication information when the pulse width is substantially the same as the reference information within a tolerable range. This configuration achieves a high accuracy and provides a capacity to cope with a broad range of frequency fluctuation of the input signal.

Further, the present invention is not limited to these embodiments, but various variations and modifications may be made without departing from the scope of the present invention.

What is claimed is:

1. A device comprising:
   a pulse-width-detection unit which detects pulse widths of an input signal supplied to said device;
   a pulse-width-information storing unit which stores the pulse widths detected by said pulse-width-detection unit;
   an operation unit which obtains indication information from the pulse widths stored in said pulse-width-information storing unit; and
   a pulse-generation unit which generates a pulse signal by delaying the input signal by a delay amount commensurate with the indication information, the pulse signal being supplied to an exterior of said device.

2. The device as claimed in claim 1, further comprising an indicating unit which compares the indication information supplied from said operation unit when reference information representing correct indication information, said indicating unit supplying the indication information to said pulse-generation unit when the indication information is substantially the same as the reference information within a tolerable margin, and otherwise supplying the reference information to said pulse-generation unit as the indication information.

3. The device as claimed in claim 2, wherein the reference information is externally supplied to said device.

4. The device as claimed in claim 2, wherein the reference information is obtained based on pieces of the indication information previously obtained by said operation unit.

5. The device as claimed in claim 1, further comprising an indicating unit which compares a pulse width supplied from said pulse-width-detection unit with reference information representing correct pulse width, said indicating unit supplying the indication information to said pulse-generation unit when the pulse width is substantially the same as the reference information within a tolerable margin, and otherwise supplying the reference information to said pulse-generation unit as the indication information.

6. The device as claimed in claim 1, further comprising an indicating unit which compares a pulse width read from said pulse-width-information storing unit with reference information representing correct pulse width, said indicating unit supplying the indication information to said pulse-generation unit when the pulse width is substantially the same as the reference information within a tolerable margin, and otherwise supplying the reference information to said pulse-generation unit as the indication information.

7. The device as claimed in claim 1, wherein said pulse-generation unit includes:

a coarse adjustment unit which makes a coarse adjustment to the delay of the pulse signal by delaying the input signal by a delay amount commensurate with upper bits of the indication information; and a fine adjustment unit which makes a fine adjustment to the delay of the pulse signal by delaying an output from said coarse adjustment unit by a delay amount commensurate with lower bits of the indication information.

8. The device as claimed in claim 1, wherein the device is implemented as a digital circuit.

9. The device as claimed in claim 1, wherein the device is implemented as an analog circuit.

* * * * *